(12) United States Patent
Cho

(10) Patent No.: US 11,398,520 B2
(45) Date of Patent: Jul. 26, 2022

(54) X-RAY DETECTOR, METHOD FOR MANUFACTURING X-RAY DETECTOR, AND MEDICAL EQUIPMENT

(71) Applicant: HKC CORPORATION LIMITED, Guangdong (CN)

(72) Inventor: En-tsung Cho, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 69 days.

(21) Appl. No.: 17/251,007

(22) PCT Filed: Dec. 27, 2019

(86) PCT No.: PCT/CN2019/129305
§ 371 (c)(1),
(2) Date: Dec. 10, 2020

(87) PCT Pub. No.: WO2020/143483
PCT Pub. Date: Jul. 16, 2020

(65) Prior Publication Data
US 2021/0257403 A1    Aug. 19, 2021

(30) Foreign Application Priority Data

Jan. 11, 2019  (CN) .......................... 201910031219.0
Jan. 11, 2019  (CN) .......................... 201910035109.1

(51) Int. Cl.
*H01L 27/146* (2006.01)

(52) U.S. Cl.
CPC .. *H01L 27/14658* (2013.01); *H01L 27/14612* (2013.01); *H01L 27/14623* (2013.01); *H01L 27/14689* (2013.01)

(58) Field of Classification Search
CPC ......... H01L 27/14612; H01L 27/14623; H01L 27/14658; H01L 27/14689
See application file for complete search history.

(56) References Cited

U.S. PATENT DOCUMENTS 5,801,385 A * 9/1998 Endo .................... G01T 1/2928
                                                   250/370.11
5,811,790 A * 9/1998 Endo ................ H01L 31/02322
                                                   257/469
(Continued)

FOREIGN PATENT DOCUMENTS

CN       1335820 A     2/2002
CN       1422310 A     6/2003
(Continued)

OTHER PUBLICATIONS

Chinese Office Action, dated Jun. 1, 2020, for HKC Corporation Limited, Chinese Application No. 201910031219.0, filed Jan. 11, 2019.

(Continued)

*Primary Examiner* — Blake C Riddick
(74) *Attorney, Agent, or Firm* — Westbridge IP LLC

(57) ABSTRACT

Disclosed are an X-ray detector, a method for manufacturing an X-ray detector and a medical equipment. The X-ray detector includes a scintillator (10); a photosensitive layer (80) including a photoelectric conversion layer (90) and a transparent conductive film (40) located between the scintillator (10) and the photoelectric conversion layer (90); the photoelectric conversion layer (90) being a uniform porous structure, and a pore of the photoelectric conversion layer being filled with a silicon particle (92); a signal reading device electrically connected to the photosensitive layer (80); and a light shielding member (30) corresponding to a position of an active layer (70) of the signal reading device to shield an incident light from the active layer (70).

20 Claims, 3 Drawing Sheets

(56) References Cited

U.S. PATENT DOCUMENTS

| | | | |
|---|---|---|---|
| 6,353,228 B1* | 3/2002 | Itabashi | H01L 27/14658 250/370.11 |
| 2003/0159711 A1* | 8/2003 | Blonigan | H01J 37/32862 134/1.2 |
| 2005/0035298 A1* | 2/2005 | Okada | G01T 1/2018 250/370.11 |
| 2007/0045554 A1* | 3/2007 | Wakamatsu | G01T 1/2018 250/370.11 |
| 2008/0245968 A1* | 10/2008 | Tredwell | H01L 27/1464 250/370.09 |
| 2008/0302969 A1* | 12/2008 | Jung | H01L 27/12 257/59 |
| 2008/0302970 A1* | 12/2008 | Fujieda | H01L 27/14663 250/370.11 |
| 2009/0084961 A1* | 4/2009 | Tonotani | G01T 1/2018 250/361 R |
| 2010/0237250 A1* | 9/2010 | Hayashi | H01L 27/14632 250/361 R |
| 2011/0024642 A1* | 2/2011 | Tredwell | H01L 27/14683 438/66 |
| 2011/0024739 A1* | 2/2011 | Shu | H01L 31/115 257/53 |
| 2011/0198505 A1* | 8/2011 | Ishida | G01T 1/202 250/363.01 |
| 2012/0061578 A1* | 3/2012 | Lim | H01L 27/14663 250/370.14 |
| 2012/0153170 A1* | 6/2012 | Nariyuki | G01T 1/2018 250/361 R |
| 2012/0168633 A1* | 7/2012 | Tredwell | G01T 1/2018 250/371 |
| 2012/0201350 A1* | 8/2012 | Kim | H01L 27/14609 438/73 |
| 2012/0298876 A1* | 11/2012 | Kaneko | G01T 7/00 250/366 |
| 2013/0082184 A1* | 4/2013 | Nakatsugawa | A61B 6/4208 250/361 R |
| 2013/0334431 A1* | 12/2013 | Ichimura | H01L 27/1462 257/59 |
| 2014/0103347 A1* | 4/2014 | Ishino | H01L 27/14689 438/59 |
| 2014/0210035 A1* | 7/2014 | Park | G01T 1/208 257/458 |
| 2014/0239183 A1* | 8/2014 | Yamazaki | G01T 1/2018 250/361 R |
| 2015/0144796 A1* | 5/2015 | Tredwell | H01L 27/14689 438/69 |
| 2015/0204986 A1* | 7/2015 | Nariyuki | A61B 6/4233 250/369 |
| 2015/0204987 A1* | 7/2015 | Okada | A61B 6/4216 250/369 |
| 2015/0316660 A1* | 11/2015 | Arimoto | G01T 1/2023 250/488.1 |
| 2016/0013243 A1* | 1/2016 | O'Rourke | H01L 31/202 257/43 |
| 2016/0155526 A1* | 6/2016 | Arimoto | C09K 11/628 250/488.1 |
| 2016/0293285 A1* | 10/2016 | Fujiwara | G01T 1/2002 |
| 2017/0092673 A1* | 3/2017 | Miyamoto | H01L 27/14616 |
| 2017/0139056 A1* | 5/2017 | Tomiyasu | H01L 27/14663 |
| 2017/0148834 A1* | 5/2017 | Tomyo | H01L 27/14692 |
| 2017/0148843 A1* | 5/2017 | Mori | H01L 27/14663 |
| 2017/0154915 A1* | 6/2017 | Tomiyasu | H01L 27/14632 |
| 2017/0160403 A1* | 6/2017 | Tomiyasu | H04N 5/374 |
| 2017/0236856 A1* | 8/2017 | Tomiyasu | H01L 27/14663 378/91 |
| 2020/0258935 A1* | 8/2020 | Huang | H01L 27/14607 |

FOREIGN PATENT DOCUMENTS

| | | |
|---|---|---|
| CN | 102628710 A | 8/2012 |
| CN | 102651380 A | 8/2012 |
| CN | 103979487 A | 8/2014 |
| CN | 104377257 A | 2/2015 |
| CN | 106539588 A | 3/2017 |
| CN | 106653789 A | 5/2017 |
| CN | 107623011 A | 1/2018 |
| CN | 108410447 A | 8/2018 |
| CN | 108470747 A | 8/2018 |
| CN | 108735834 A | 11/2018 |
| CN | 109768062 A | 5/2019 |
| CN | 109841636 A | 6/2019 |

OTHER PUBLICATIONS

Chinese Office Action, dated Jun. 22, 2020, for HKC Corporation Limited, Chinese Application No. 201910035109.1, filed Jan. 11, 2019.

International Search Report, dated Mar. 31, 2020, for HKC Corporation Limited, International Application No. PCT/CN2019/129305, filed Dec. 27, 2019.

Written Opinion of International Search Authority, dated Mar. 31, 2020, for HKC Corporation Limited, International Application No. PCT/CN2019/129305, filed Dec. 27, 2019.

* cited by examiner

X-RAY DETECTOR, METHOD FOR MANUFACTURING X-RAY DETECTOR, AND MEDICAL EQUIPMENT

CROSS-REFERENCE TO RELATED APPLICATIONS

This application is the National Stage of International Application No. PCT/CN2019/129305, filed on Dec. 27, 2019, which claims priority to Chinese Application No. 201910035109.1, filed on Jan. 11, 2019, entitled "X-RAY DETECTOR, METHOD FOR MANUFACTURING X-RAY DETECTOR, AND MEDICAL EQUIPMENT", and Chinese Application No. 201910031219.0, filed on Jan. 11, 2019, entitled "X-RAY DETECTOR AND DISPLAY DEVICE WITH THE SAME", the entire disclosure of which is incorporated herein by reference.

TECHNICAL FIELD

The present disclosure relates to the technical field of detectors, in particular to an X-ray detector, a method for manufacturing an X-ray detector, and a medical equipment with an X-ray detector.

BACKGROUND

The statements here only provide background information related to the present disclosure, and do not necessarily constitute related art.

X-ray detectors are widely used in medical instruments, such as chest X-ray imaging using X-rays. In the exemplary technology, the photoelectric conversion of the X-ray detector is mainly completed by the amorphous silicon photosensitive layer. X-rays are converted into visible light by the scintillator (currently mainly CsI), and then the visible light is converted into electrical signals by the amorphous silicon photosensitive layer, and the electrical signals are output by the signal reading device (Thin film transistor, TFT for short). Since the structure of amorphous silicon is not stable enough and the light conversion efficiency is low, causing the amorphous silicon photosensitive layer absorbs a wide range of light waves and is not sensitive to light conversion, which directly affects the photoelectric conversion efficiency of the X-ray detector.

SUMMARY

The main objective of the present disclosure is to provide an X-ray detector, which aims to improve the photoelectric conversion efficiency of the X-ray detector.

In order to achieve the above objective, the present disclosure provides an X-ray detector, including:

a scintillator located on a light incident side of the X-ray detector and configured to convert X-rays into visible light;

a photosensitive layer located on a light exit side of the scintillator and configured to perform photoelectric conversion on the visible light, the photosensitive layer including a photoelectric conversion layer and a transparent conductive film located between the scintillator and the photoelectric conversion layer; the photoelectric conversion layer being a uniform porous structure, and a pore of the photoelectric conversion layer being filled with a silicon particle;

a signal reading device electrically connected to the photosensitive layer; and a light shielding member located between the scintillator and the signal reading device, the light shielding member corresponding to a position of an active layer of the signal reading device to shield an incident light from the active layer.

In an embodiment, the silicon particle is nano silicon.

In an embodiment, the uniform porous structure is formed of one of silicon nitride, silicon oxycarbide, silicon carbide, and silicon oxynitride.

In an embodiment, the uniform porous structure is formed of more of silicon nitride, silicon oxycarbide, silicon carbide, and silicon oxynitride.

In an embodiment, wherein the photosensitive layer is electrically connected to a drain of the signal reading device, and an electrical signal generated by the photosensitive layer is output through the signal reading device.

In an embodiment, the transparent conductive film is electrically connected to the photoelectric conversion layer.

In an embodiment, the porous structure is formed of $Si_xO_y$.

In an embodiment, the photosensitive layer and the light shielding member are vertically stacked between the scintillator and the signal reading device, and the photosensitive layer is located on a light incident side of the light shielding member.

In an embodiment, wherein the photosensitive layer and the light shielding member are arranged side by side between the scintillator and the signal reading device.

In an embodiment, the photoelectric conversion layer penetrates an insulating protective layer of the signal reading device and is electrically connected to a drain of the signal reading device.

In an embodiment, the photosensitive layer further includes a P-doped layer and an N-doped layer; the P-doped layer is located on a light incident side of the photosensitive layer and located between the transparent conductive film and the photoelectric conversion layer; and the N-doped layer is located on a light exit side of the photoelectric conversion layer.

In an embodiment, the photosensitive layer further includes an insulating medium, the P-doped layer and the N-doped layer are wrapped in the insulating medium to insulate the P-doped layer and the N-doped layer.

In an embodiment, the X-ray detector further includes a protective layer filling a gap between the signal reading device and the scintillator to isolate the light shielding member, the photosensitive layer and the signal reading device from an external environment.

In an embodiment, the protective layer is made of silicon nitride or silicon oxide.

In an embodiment, the photoelectric conversion layer avoids an insulating protective layer of a thin film transistor, and is electrically connected to a drain of the thin film transistor through a wire.

In an embodiment, the signal reading device is an array substrate composed of thin film transistors.

In an embodiment, the scintillator includes cesium iodide.

The present disclosure further provides a method for manufacturing an X-ray detector, including the following operations:

controlling a concentration of surfactant in an alcohol solution to be between 35% and 70% during chemical vapor deposition of $Si_xO_y$, to make $Si_xO_y$ form a uniform porous structure; and filling silane gas into $Si_xO_y$ alcohol solution with the porous structure, and simultaneously filling hydrogen, to make the silane form an elemental silicon particle in a pore of $Si_xO_y$.

In an embodiment, the silane gas is filled into the $Si_xO_y$ alcohol solution in a pulsed manner.

The present disclosure further provides a medical equipment, including an X-ray detector and an imaging device electrically connected to the signal reading device of the X-ray detector:

the X-ray detector, including:

a scintillator located on a light incident side of the X-ray detector and configured to convert X-rays into visible light;

a photosensitive layer located on a light exit side of the scintillator and configured to perform photoelectric conversion on the visible light, the photosensitive layer including a photoelectric conversion layer and a transparent conductive film located between the scintillator and the photoelectric conversion layer; the photoelectric conversion layer being a uniform porous structure, and a pore of the photoelectric conversion layer being filled with a silicon particle;

a signal reading device electrically connected to the photosensitive layer; and a light shielding member located between the scintillator and the signal reading device, the light shielding member corresponding to a position of an active layer of the signal reading device to shield an incident light from the active layer.

In technical solutions of the present disclosure, the photoelectric conversion layer made of amorphous silicon in the photosensitive layer of the X-ray detector is replaced with a photoelectric conversion layer with a uniform porous structure and filled with silicon particles. The photoelectric conversion layer with a uniform porous structure and filled with silicon particles is used to photoelectrically convert the visible light, so that the photosensitive layer converts optical signals into electrical signals. Due to the uniform size of silicon particles in a uniform porous structure, the absorption of light waves is more stable than that of amorphous silicon, such that the X-ray detector using mesoporous silicon as the photoelectric conversion layer has more sensitive photoelectric conversion performance and higher photoelectric conversion efficiency.

BRIEF DESCRIPTION OF THE DRAWINGS

In order to more clearly illustrate the embodiments of the present disclosure, drawings used in the embodiments will be briefly described below. Obviously, the drawings in the following description are only some embodiments of the present disclosure. It will be apparent to those skilled in the art that other figures can be obtained according to the structures shown in the drawings without creative work.

The realization of the objective, functional characteristics, and advantages of the present disclosure are further described with reference to the accompanying drawings.

DETAILED DESCRIPTION OF THE EMBODIMENTS

The technical solutions of the embodiments of the present disclosure will be described in more detail below with reference to the accompanying drawings. It is obvious that the embodiments to be described are only some rather than all of the embodiments of the present disclosure. All other embodiments obtained by persons skilled in the art based on the embodiments of the present disclosure without creative efforts shall fall within the scope of the present disclosure.

It should be noted that, if there are directional indications (such as up, down, left, right, front, rear . . . ) in the embodiments of the present disclosure, the directional indication is only used to explain the relative positional relationship, movement, etc. between the various components in a specific posture (as shown in the figure). If the specific posture changes, the directional indication will change accordingly.

In addition, the descriptions associated with, e.g., "first" and "second," in the present disclosure are merely for descriptive purposes, and cannot be understood as indicating or suggesting relative importance or impliedly indicating the number of the indicated technical feature. Therefore, the feature associated with "first" or "second" can expressly or impliedly include at least one such feature. Besides, the technical solutions between the various embodiments can be combined with each other, but they must be based on the realization of those of ordinary skill in the art. When the combination of technical solutions is contradictory or cannot be achieved, it should be considered that such a combination of technical solutions does not exist, nor is it within the scope of the present disclosure.

Figure 1:
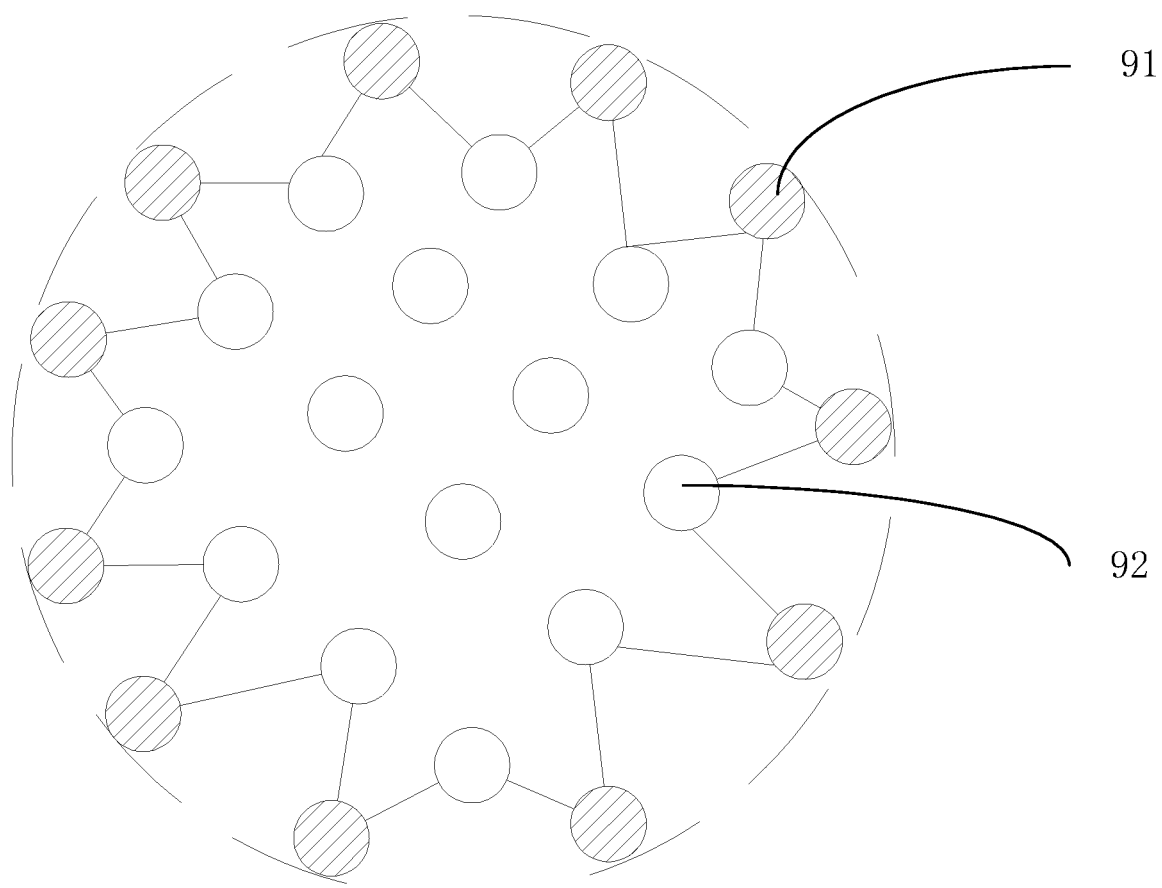
FIG. 1 is a schematic structural diagram of a photosensitive layer according to an embodiment of the present disclosure.
Figure 2:
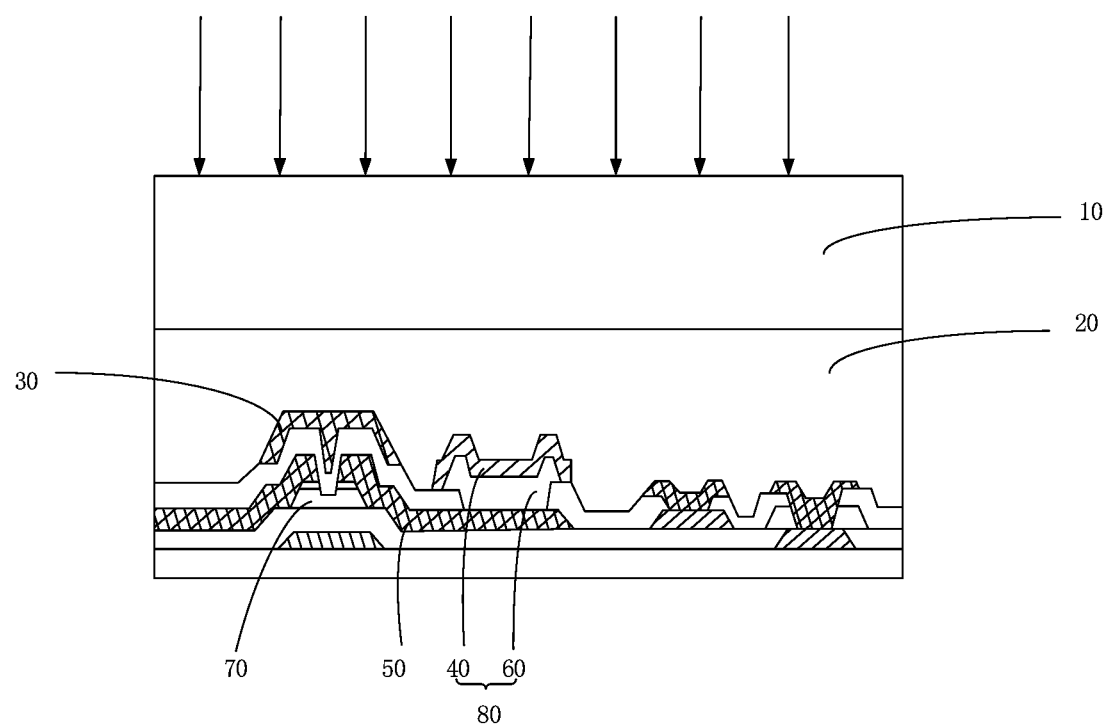
FIG. 2 is a schematic structural diagram of an X-ray detector according to an embodiment of the present disclosure.
Figure 3:
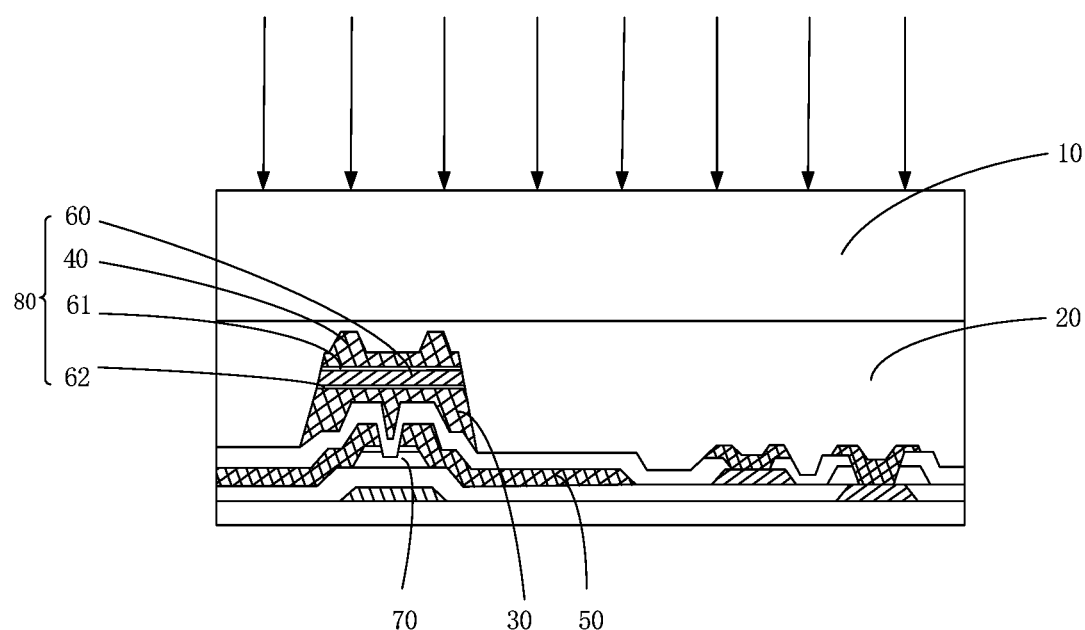
FIG. 3 is a schematic structural diagram of the X-ray detector according to another embodiment of the present disclosure.

As shown in FIGS. 1 to 3, the present disclosure provides an X-ray detector, including: a scintillator 10 located on a light incident side of the X-ray detector and configured to convert X-rays into visible light; a photosensitive layer 80 located on a light exit side of the scintillator 10 and configured to perform photoelectric conversion on the visible light. The photosensitive layer 80 includes a photoelectric conversion layer 90 and a transparent conductive film 40 located between the scintillator 10 and the photoelectric conversion layer 90; the photoelectric conversion layer 90 has a uniform porous structure, and a pore of the photoelectric conversion layer 90 is filled with a silicon particle 92; a signal reading device (not shown) electrically connected to the photosensitive layer 80; and a light shielding member 30 located between the scintillator 10 and the signal reading device, the light shielding member corresponding to a position of an active layer 70 of the signal reading device to shield an incident light from the active layer 70.

In this embodiment, the main component of scintillator 10 is CsI. X-rays enter the scintillator 10 from the light incident side of the scintillator 10, and are converted into visible light by the scintillator 10. After the photosensitive layer 80 is exposed to the visible light, the photosensitive layer 80 generates a photoelectric effect to convert the light signal into an electrical signal. Since the photosensitive layer 80 is electrically connected to a drain 50 of the signal reading device, the electrical signal is output through the signal reading device, realizing the photoelectric conversion function of the X-ray detector. Since there is an amorphous silicon layer in the signal reading device, if visible light enters the signal reading device, the electrical signal transmitted in the signal reading device will change. Therefore, in order to prevent visible light from entering the signal reading device, a light shielding member 30 is provided on a light incident side of the signal reading device, and the light shielding member 30 blocks the light directed to the active layer 70 of the signal reading device. The signal reading device only transmits electrical signals from the photosensitive layer 80 to complete the signal reading function of the photosensitive layer 80.

As shown in FIG. 1, in this embodiment, the photoelectric conversion layer 90 has a mesoporous structure, and the mesoporous structure is uniform, and the pores are filled with silicon particles 92 to form a mesoporous silicon layer 60. The uniform porous structure is formed by $Si_xO_y$ 91. When the mesoporous silicon is formed into a film, different surfactants are used to control a size of the pores, thereby controlling a size of the silicon particles 92 filled in the pores. It is understandable that the uniform porous structure may also be formed of one or more of $SiN_x$, $SiO_xC_y$, $SiC_x$ and $SiO_xN_y$.

The silicon particles 92 are nano silicon. The size of the silicon particles 92 is determined by the size of the pores. The larger the pore, the larger the silicon particles 92 filled in the pore, and the longer the light wave absorbed. The uniform pore structure makes the size of the silicon particles 92 filled therein uniform, so the absorption of light wavelength is stable, and the photoelectric conversion is more sensitive.

The transparent conductive film 40 is located between the scintillator 10 and the photoelectric conversion layer 90, and is electrically connected to the mesoporous silicon layer 60. The transparent conductive film 40 is used to apply voltage, and light is injected from the transparent conductive film 40 into the mesoporous silicon layer 60, and the mesoporous silicon layer 60 converts electrical signals into optical signals.

As an example, the photosensitive layer 80 further includes a P-doped layer 61 and an N-doped layer 62. The P-doped layer 61 is located on a light incident side of the mesoporous silicon layer 60 and located between the transparent conductive film 40 and the mesoporous silicon layer 60; and the N-doped layer 62 is located on a light exit side of the mesoporous silicon layer 60. The photosensitive layer 80 further includes an insulating medium, the P-doped layer 61 and the N-doped layer 62 are wrapped in the insulating medium, such that the P-doped layer 61 and the N-doped layer 62 are insulated.

When the photosensitive layer 80 is connected to the signal reading device, the structure formed by the P-doped layer 61, the mesoporous silicon layer 60, and the N-doped layer 62 functions as a capacitor, preventing the electrical signal generated by the photoelectric effect of the mesoporous silicon layer 60 from being lost, so that the electrical signal can flow to the signal reading device to the greatest extent. In this embodiment, the signal reading device is an array substrate composed of thin film transistors (TFT for short), and the array substrate transmits the read electrical signal to an external display device to complete the output of the electrical signal.

There are two ways to set the position of the photosensitive layer 80. The first is that the photosensitive layer 80 is located between the scintillator 10 and the light shielding member 30. The second is that the photosensitive layer 80 and the light shielding member 30 are arranged side by side between the scintillator 10 and the signal reading device.

As shown in FIG. 2, when the photosensitive layer 80 is located between the scintillator 10 and the light shielding member 30, the mesoporous silicon layer 60 is electrically connected to the drain 50 of the signal reading device through a wire, and the electrical signal generated by the mesoporous silicon layer 60 is read by the signal reading device. This arrangement allows the photosensitive layer 80 to be irradiated by visible light in a large area without being restricted by the signal reading device, and has a high photoelectric conversion efficiency. When the X-ray detector is applied to medical equipment, the arrangement of the photosensitive layer 80 between the scintillator 10 and the light shielding member 30 can reduce the exposure time of the patient under X-rays or reduce the intensity of X-rays. Since the X-ray detector has a high photoelectric conversion efficiency, it can achieve the same imaging effect, thus reducing the impact of X-rays on patients.

As shown in FIG. 3, FIG. 3 is a second arrangement form of the photosensitive layer 80: that is, the photosensitive layer 80 and the light shielding member 30 are arranged side by side between the scintillator 10 and the signal reading device. At this time, the mesoporous silicon layer 60 penetrates the insulating protective layer of the signal reading device and is electrically connected to the drain 50 of the signal reading device. Since the mesoporous silicon layer 60 is in direct contact with the drain 50 of the signal reading device, the electrical signal generated by the photoelectric effect of the mesoporous silicon layer 60 can directly enter the signal reading device from the drain 50. Therefore, the mesoporous silicon layer 60 can be provided separately, and the P-doped layer 61 and the N-doped layer 62 are not required.

In the above two arrangements of the photosensitive layer 80, the mesoporous silicon layer 60 does not require the P-doped layer 61 and the N-doped layer 62, and forms the photosensitive layer 80 with the transparent conductive film 40 without the P-doped layer 61 and the N-doped layer 62; the mesoporous silicon layer 60 may include the P-doped layer 61 and the N-doped layer 62 to form the photosensitive layer 80 to perform photoelectric conversion of visible light from the scintillator 10. In actual production, the manufacturing process of the P-doped layer 61 and the N-doped layer 62 is complicated and expensive. The form of directly omitting the P-doped layer 61 and the N-doped layer 62 greatly reduces the production cost of the X-ray detector and simplifies the process flow.

The photosensitive layer 80 using mesoporous silicon as the photoelectric conversion layer 90 has more sensitive photoelectric conversion performance and higher photoelectric conversion efficiency. Therefore, when this embodiment is applied to an X-ray detector, the X-ray detector has more sensitive photoelectric conversion performance, and the photoelectric conversion efficiency is also higher than that of an X-ray detector that uses amorphous silicon diodes for photoelectric conversion.

In order to prevent the P-doped layer 61 and the N-doped layer 62 from being energized during the manufacturing process, resulting in manufacturing failure, the photosensitive layer 80 further includes an insulating medium surrounding the P-doped layer 61 and the N-doped layer 62 to insulate the P-doped layer 61 and the N-doped layer 62.

Further, the X-ray detector includes a protective layer 20. The protective layer 20 fills a gap between the signal reading device and the scintillator 10 to isolate the light shielding member 30, the photosensitive layer 80 and the signal reading device from the external environment.

In order to prevent the loss of electrical signals, the components of the X-ray detector need to be strictly isolated from the external environment. Therefore, the X-ray detector includes a protective layer 20. The protective layer 20 fills the gap between the signal reading device and the scintillator 10 to isolate the light shielding member 30, the photosensitive layer 80 and the signal reading device from the external environment.

In an embodiment, the protective layer 20 and the insulating layer may be made of the same material, such as $SiN_x$, or of different materials, such as the insulating layer is made of $SiN_x$, the protective layer 20 is made of $SiO_x$, and the insulating layer and the protective layer 20 are provided separately at this time.

The present disclosure further provides a method for manufacturing an X-ray detector. The method for manufacturing the photoelectric conversion layer 90 of the X-ray detector includes the following operations: controlling a concentration of surfactant in an alcohol solution to be between 35% and 70% during chemical vapor deposition of $Si_xO_y$, to make $Si_xO_y$ form a uniform porous structure; and filling silane gas into $Si_xO_y$ alcohol solution with a porous structure, and simultaneously filling hydrogen, to make the silane form an elemental silicon particle 92 in a pore of $Si_xO_y$.

Specially, the silane gas is filled into the $Si_xO_y$, $SiN_x$, $SiO_xC_y$, $SiC_x$ or $SiO_xN_y$ alcohol solution in a pulsed manner.

As shown in FIG. 4, in this embodiment, $Si_xO_y$ 91 is taken as an example. The porous structure of $Si_xO_y$ 91 is formed in an alcohol solution. The alcohol solution contains surfactants to induce $Si_xO_y$ to form a uniform pore structure. The volatilization of alcohol increases the concentration of surfactants. When the concentration of surfactant approaches 10%, $Si_xO_y$ 91 begins to form a porous structure. When the concentration reaches 35%, the pore structure of $Si_xO_y$ 91 is relatively uniform, and they are closely arranged into a honeycomb shape. This state continues until the surfactant concentration exceeds 70%. When the concentration exceeds 70%, $Si_xO_y$ 91 forms a lamellar liquid crystal, which is not convenient for filling with silicon particles 92.

The concentration of surfactant in an alcohol solution is controlled to be between 35% and 70% during chemical vapor deposition of one or more of $SiN_x$, $SiO_xC_y$, $SiC_x$ or $SiO_xN_y$, such that one or more of $SiN_x$, $SiO_xC_y$, $SiC_x$ or $SiO_xN_y$ form a uniform porous structure; and the silane gas is filled into $SiN_x$, $SiO_xC_y$, $SiC_x$ or $SiO_xN_y$ alcohol solution with a porous structure, and simultaneously hydrogen is filled, such that the silane forms an elemental silicon particle 64 in a pore of $SiN_x$, $SiO_xC_y$, $SiC_x$ or $SiO_xN_y$. x, y are the number of atoms, such as $SiN_x$ may be $SiN_2$.

The pore size is controlled by different surfactants. For example, P123 makes the size of the pore structure of $Si_xO_y$ 91 in the range of 5 nm to 7 nm. CTAB makes the size of the pore structure of $Si_xO_y$ 91 in the range of 2.5 nm to 4.5 nm. F127 makes the size of the pore structure of $Si_xO_y$ 91 in the range of 2.5 nm to 4.5 nm. The silicon particles 92 filled in the pores are also limited to a corresponding size range, so as to control the size of the silicon particles 92. Since the fixed-size silicon particles 92 can only absorb light with a specific wavelength, such that the mesoporous silicon structure can stably absorb light with a wavelength within a specific range, mesoporous silicon has a more sensitive response to light and a higher photoelectric conversion efficiency than amorphous silicon. It is understandable that the types of surfactants are not limited to the above three types.

In an embodiment, the silane gas is filled into the $Si_xO_y$ alcohol solution in a pulsed manner, and hydrogen is filled simultaneously, but the hydrogen is continuously filled such that the silane may enter the pore structure of $Si_xO_y$ 91, interact with the oxygen ions and hydroxide ions therein to form silicon particles 92, which are filled in the pore structure of $Si_xO_y$ 91. As shown in FIG. 5, in the pore structure of $Si_xO_y$ 91, silicon and oxygen ions on the inner wall of $Si_xO_y$ 91 combine with hydroxide ions. When the number of oxygen ions and hydroxide ions is insufficient, silicon ions will combine with silicon ions to form silicon particles 92. Therefore, the smaller the concentration of oxygen ions and hydroxide ions, the larger the silicon particles 92.

It is understandable that the method for filling hydrogen and silane is not limited by the above two, as long as the silane can generate silicon particles 92 in the pore structure of $Si_xO_y$ 91.

The present disclosure further provides a medical equipment. The medical equipment includes the aforementioned X-ray detector and an imaging device, the X-ray detector is electrically connected with the imaging device, and the electrical signal generated by the X-ray detector due to the photoelectric effect forms an image through the imaging device.

In this embodiment, since the photosensitive layer 80 in the X-ray detector with the photoelectric conversion function has sensitive and efficient photoelectric conversion performance, under the same imaging effect, the X-ray irradiation intensity or irradiation time can be reduced, and the impact on the patient can be reduced.

The above are only optional embodiments of the present disclosure, and do not limit the scope of the present disclosure. Under the inventive concept of the present disclosure, any equivalent structural transformations made using the contents of the description and drawings of the present disclosure, or direct/indirect application in other related technical fields are included in the scope of the present disclosure.

What is claimed is:

1. An X-ray detector, comprising:
   a scintillator located on a light incident side of the X-ray detector and configured to convert X-rays into visible light;
   a photosensitive layer located on a light exit side of the scintillator and configured to perform photoelectric conversion on the visible light, the photosensitive layer comprising a photoelectric conversion layer and a transparent conductive film located between the scintillator and the photoelectric conversion layer; the photoelectric conversion layer being a uniform porous structure, and a pore of the photoelectric conversion layer being filled with a silicon particle;
   a signal reading device electrically connected to the photosensitive layer; and
   a light shielding member located between the scintillator and the signal reading device, the light shielding member corresponding to a position of an active layer of the signal reading device to shield an incident light from the active layer.

2. The X-ray detector of claim 1, wherein the silicon particle is nano silicon.

3. The X-ray detector of claim 1, wherein the uniform porous structure is formed of one of silicon nitride, silicon oxycarbide, silicon carbide, and silicon oxynitride.

4. The X-ray detector of claim 1, wherein the uniform porous structure is formed of more of silicon nitride, silicon oxycarbide, silicon carbide, and silicon oxynitride.

5. The X-ray detector of claim 1, wherein the photosensitive layer is electrically connected to a drain of the signal reading device, and an electrical signal generated by the photosensitive layer is output through the signal reading device.

6. The X-ray detector of claim 1, wherein the transparent conductive film is electrically connected to the photoelectric conversion layer.

7. The X-ray detector of claim 1, wherein the porous structure is formed of $Si_xO_y$.

8. The X-ray detector of claim 1, wherein the photosensitive layer and the light shielding member are vertically stacked between the scintillator and the signal reading device, and the photosensitive layer is located on a light incident side of the light shielding member.

9. The X-ray detector of claim 8, wherein the photoelectric conversion layer penetrates an insulating protective layer of the signal reading device and is electrically connected to a drain of the signal reading device.

10. The X-ray detector of claim 1, wherein the photosensitive layer and the light shielding member are arranged side by side between the scintillator and the signal reading device.

11. The X-ray detector of claim 1, wherein:
the photosensitive layer further comprises a P-doped layer and an N-doped layer;
the P-doped layer is located on a light incident side of the photosensitive layer and located between the transparent conductive film and the photoelectric conversion layer; and
the N-doped layer is located on a light exit side of the photoelectric conversion layer.

12. The X-ray detector of claim 11, wherein the photosensitive layer further comprises an insulating medium, the P-doped layer and the N-doped layer are wrapped in the insulating medium to insulate the P-doped layer and the N-doped layer.

13. The X-ray detector of claim 11, wherein the protective layer is made of silicon nitride or silicon oxide.

14. The X-ray detector of claim 1, wherein the X-ray detector further comprises a protective layer filling a gap between the signal reading device and the scintillator to isolate the light shielding member, the photosensitive layer and the signal reading device from an external environment.

15. The X-ray detector of claim 1, wherein the photoelectric conversion layer avoids an insulating protective layer of a thin film transistor, and is electrically connected to a drain of the thin film transistor through a wire.

16. The X-ray detector of claim 1, wherein the signal reading device is an array substrate composed of thin film transistors.

17. The X-ray detector of claim 1, wherein the scintillator comprises cesium iodide.

18. A method for manufacturing an X-ray detector, comprising the following operations:
controlling a concentration of surfactant in an alcohol solution to be between 35% and 70% during chemical vapor deposition of $Si_xO_y$, to make $Si_xO_y$ form a uniform porous structure; and
filling silane gas into $Si_xO_y$ alcohol solution with the porous structure, and simultaneously filling hydrogen, to make the silane form an elemental silicon particle in a pore of $Si_xO_y$.

19. The method for manufacturing an X-ray detector of claim 18, wherein the silane gas is filled into the $Si_xO_y$ alcohol solution in a pulsed manner.

20. A medical equipment, comprising:
an X-ray detector, comprising:
a scintillator located on a light incident side of the X-ray detector and configured to convert X-rays into visible light;
a photosensitive layer located on a light exit side of the scintillator and configured to perform photoelectric conversion on the visible light, the photosensitive layer comprising a photoelectric conversion layer and a transparent conductive film located between the scintillator and the photoelectric conversion layer; the photoelectric conversion layer being a uniform porous structure, and a pore of the photoelectric conversion layer being filled with a silicon particle;
a signal reading device electrically connected to the photosensitive layer; and
a light shielding member located between the scintillator and the signal reading device, the light shielding member corresponding to a position of an active layer of the signal reading device to shield an incident light from the active layer; and
an imaging device electrically connected to the signal reading device of the X-ray detector.

* * * * *